(12) United States Patent
Kawakami

(10) Patent No.: US 7,544,964 B2
(45) Date of Patent: Jun. 9, 2009

(54) METHOD FOR FABRICATING THIN LAYER DEVICE

(75) Inventor: Akira Kawakami, Tokyo (JP)

(73) Assignee: National Institute of Information and Communications Technology, Incorporated Administrative Agency, Tokyo (JP)

( * ) Notice: Subject to any disclaimer, the term of this patent is extended or adjusted under 35 U.S.C. 154(b) by 137 days.

(21) Appl. No.: 11/525,997

(22) Filed: Sep. 25, 2006

(65) Prior Publication Data

US 2007/0128829 A1 Jun. 7, 2007

(30) Foreign Application Priority Data

Dec. 1, 2005 (JP) ............................ 2005-348355

(51) Int. Cl.
*H01L 39/22* (2006.01)
*H01L 21/84* (2006.01)
(52) U.S. Cl. .................. 257/32; 438/977; 438/459; 438/2; 257/661; 257/E39.006; 257/E39.015; 257/E39.018
(58) Field of Classification Search ................ 438/455, 438/458, 459, 977, 2; 257/31, 32, 661, E39.006, 257/E39.014, E39.015, E39.018
See application file for complete search history.

(56) References Cited

U.S. PATENT DOCUMENTS

| | | | | |
|---|---|---|---|---|
| 5,013,681 A | * | 5/1991 | Godbey et al. | 438/459 |
| 5,024,723 A | * | 6/1991 | Goesele et al. | 438/459 |
| 6,653,209 B1 | * | 11/2003 | Yamagata | 438/459 |
| 6,756,285 B1 | * | 6/2004 | Moriceau et al. | 438/455 |
| 6,887,770 B2 | * | 5/2005 | Ueda et al. | 438/455 |

FOREIGN PATENT DOCUMENTS

JP 2001-352109 A 12/2001

OTHER PUBLICATIONS

Takeda et al., Waveguide-type all-NbN SIS mixers on MgO substrates.

* cited by examiner

*Primary Examiner*—M. Wilczewski
(74) *Attorney, Agent, or Firm*—Birch, Stewart, Kolasch & Birch, LLP

(57) ABSTRACT

A method for producing a thin layer device such as a superconductive device excellent in mechanical strength and useful as a submillimeter band receiver is provided. The thin layer device is produced by forming a multilayer structure substance comprising an NbN/MgO/NbN-SIS junction on an MgO temporary substrate, then forming $SiO_2$, as a substrate, on said multilayer structure substance, and subsequently removing the MgO temporary substrate by etching. A superconductive device (a thin layer device) produced by a method of the present invention has excellent performance and high mechanical strength, and therefore introduction to a waveguide for a submillimeter band is also easy.

12 Claims, 12 Drawing Sheets

(a)

(b)

(c)

(a)

(b)

METHOD FOR FABRICATING THIN LAYER DEVICE

BACKGROUND OF THE INVENTION

1. Field of the Invention

The present invention relates to a method for fabricating a thin layer device, and in more detail the present invention relates to a method for fabricating a thin layer device such as a superconductive device having an SIS junction on a $SiO_2$ substrate, and a superconductive device.

2. Description of the Related Art

In the fields of global environment measurement or radio astronomy and the next generation wireless communication, development of a receiver or oscillator for a submillimeter band has been desired, and research and development of a superconductive device such as the Josephson junction has been made as an example. A superconductive SIS (Superconductor-Insulator-Superconductor) junction which is one of the Josephson junction flows superconductive tunneling current between two superconductive electrodes up to a critical current, while generation of voltage between two superconductive electrodes over this value. Moreover, current-voltage characteristics of the junction have a very strong nonlinear characteristics not attained by a semiconductor device.

At present, in a frequency range between 300 GHz to 725 GHz, an SIS receiver using the SIS junction shows the lowest noise temperature, for example, an Nb-based SIS receiver used for up to 725 GHz, which is the gap-frequency of niobium (Nb), having super low noise has already been developed. However, in frequency range over 725 GHz, performance of an SIS receiver is abruptly deteriorated due to increase in electrode loss caused by superconductive electron-pair breaking in Nb electrodes.

Under these circumstances, development of an SIS receiver using niobium nitride (NbN) having large superconductive gap energy and low loss characteristics up to 1.4 THz, has been carrying out. However, this low loss characteristics of NbN largely depends on crystallinity of an NbN thin film, and therefore introduction to development of a submillimeter band device of NbN requires device production technology while maintaining good crystallinity. In other words, NbN-based SIS junction is required to be composed of only a multilayer film of epitaxially grown NbN, MgO, and the like.

On the other hand, $SiO_2$ having low dielectric constant has conventionally been used as a substrate for producing a submillimeter band receiver, however, there are no reports on epitaxial growth of NbN in the case of using a $SiO_2$ substrate, and a rock salt-type single crystal substrate such as MgO is widely used at present. Practically, formation technology of an SIS junction composed of an NbN layer/an MgO layer/an NbN layer (hereinafter called as an NbN/MgO/NbN-SIS junction) on an MgO substrate has been disclosed (JP-A-2001-352109). In the publication, an NbN layer, a thin MgO layer and further an NbN layer are each formed by epitaxial growth on an MgO substrate.

In this connection, a waveguide mixer for a submillimeter band is required to be produced on sufficiently thinner substrate than wavelength in the waveguide. As a guideline of substrate thickness of a mixer for 1 THz waveguide, not thicker than ¼ wavelength of electromagnetic wave in a substrate, namely, not thicker than about 40 μm for a $SiO_2$ substrate and not thicker than 27 μm for an MgO substrate is required. Production of a device using a substrate having this level of thickness while maintaining sufficient surface area of the substrate is difficult, and therefore, generally, an SIS junction is produced on a substrate having a thickness of several hundreds μm, and then the substrate is subjected to mechanical polishing to finally adjust to objective substrate thickness.

An NbN-based SIS mixer produced on an MgO substrate by such a method exhibits certain level of performance, when introduced to a mixer for a submillimeter band waveguide (Waveguide-type all-NbN SIS mixers on MgO substrates by Masanori Takeda et al., Advanced Research Center, National Institute of Information and Communications Technology).

SUMMARY OF THE INVENTION

However, an MgO single crystal substrate is labile to crack by cleavage and the like, and a thin substrate causes mechanical strength reduction, which make substantially difficult to obtain arbitrary substrate thickness in good reproducibility.

Subsequently, it is an object of the present invention to provide a method for producing a thin layer device excellent in mechanical strength and ensuring sufficient thickness, by mounting an epitaxial multilayer structure substance such as an NbN/MgO/NbN-SIS junction on a $SiO_2$ substrate which is useful as material for a submillimeter band.

It is also an object of the present invention to provide a thin layer device obtained by the above method for production, an SIS receiver and an HEB (Hot-Electron-Bolometer) receiver composed of the thin layer device.

The present inventors have extensively studied on production technology of an NbN/MgO/NbN-SIS junction to solve the above-described problems and found that by using MgO as a temporary substrate, and producing an epitaxial NbN/MgO/NbN-SIS junction composed of an NbN layer/an MgO layer/an NbN layer formed by epitaxial growth (hereinafter called also as an epitaxial NbN/MgO/NbN) on the temporary substrate, and by subsequent film forming of $SiO_2$ having a thickness of several tens μm as a substrate on the NbN/MgO/NbN-SIS junction produced by epitaxial growth, and then by removing the above MgO temporary substrate by an acid and the like, a thin layer device mounted with the NbN/MgO/NbN-SIS junction on a $SiO_2$ substrate having a thickness of several tens μm can be produced, and also found that by using the above thin layer device mounted with the NbN/MgO/NbN-SIS junction on a $SiO_2$ substrate which has particularly excellent mechanical strength and is effective as material for a submillimeter band, a superconductive device, a mixer, and an HEB electromagnetic wave receiver composed of the thin layer device can be obtained, and have thus completed the present invention.

According to the present invention, uniformly polishing technology is not required, because $SiO_2$ having a thickness of several tens μm is formed as a substrate by a film forming method, and the above MgO temporary substrate is removed by etching, and moreover, sufficient substrate thickness can be secured and a superconductive device in mechanical strength can be produced, compared with using MgO as a substrate, because $SiO_2$ having relatively low dielectric constant is used as a substrate. In addition, excellent control of substrate thickness is possible because a substrate of $SiO_2$ and the like is produced by a film forming method.

The above thin layer device includes a superconductive device such as an SIS receiver or an HEB receiver. Production of a grounding conductor is also possible by film forming and lithography during production of a thin film device, which enables to attain steady and good grounding.

BRIEF DESCRIPTION OF THE DRAWINGS

FIGS. 10(a) and (b) are cross-sectional views, obtained by using a dicing saw, of an SIS mixer produced on a $SiO_2$ substrate, and FIG. 10(c) shows a transmitted view of an SIS mixer through a $SiO_2$ substrate from the rear side of the substrate.

DESCRIPTION OF THE PREFERRED EMBODIMENT(S)

The first aspect of the present invention is a method for fabricating a thin layer device, which comprises a step of formation of a multilayer structure substance obtained by thin film deposition on a temporary substrate and subsequent a step of formation of a substrate on the multilayer structure substance.

In the present invention, a temporary substrate is not especially limited as long as it forms a multilayer structure substance, and can be removed by an acid and the like. When a multilayer structure substance is composed of an epitaxially grown NbN layer, MgO layer and NbN layer, an MgO single crystal substrate is preferable as a substrate suitable to epitaxial growth of an NbN layer.

In addition, as the multilayer structure substance, a multilayer composed of thin films formed by epitaxial growth is preferable, and the composition may be selected, as appropriate, in accordance with the intended use of the resultant thin layer device. For example, when a thin layer device is a superconductive device, a multilayer structure substance formable an SIS junction is preferable, for example, a multilayer structure substance composed of an NbN layer/an MgO layer/an NbN layer having an NbN layer obtained by epitaxial growth, as a superconductive layer, and a single crystal MgO layer as an insulating layer and the like may be used.

In addition, the above substrate may be selected, as appropriate, in accordance with the intended use of the resultant thin layer device, from $SiO_2$, MgO, $Al_2O_3$, and the like. Among them, $SiO_2$ is suitable for use as a receiver for a submillimeter band, due to having low dielectric constant, and can be formed in a range of several tens nm to several tens μm. In addition, sufficient substrate strength can also be secured in cutting out, because thicker setting is possible than using MgO as a substrate. In addition, MgO has advantages in possibility of epitaxial growth and having high thermal conductivity, excellent lattice matching with NbN and the like.

A method for producing a thin layer device, wherein a multilayer structure substance is an NbN/MgO/NbN-SIS junction formed by epitaxial growth, is shown below as an example of a thin layer device of the present invention.

Figure 1:
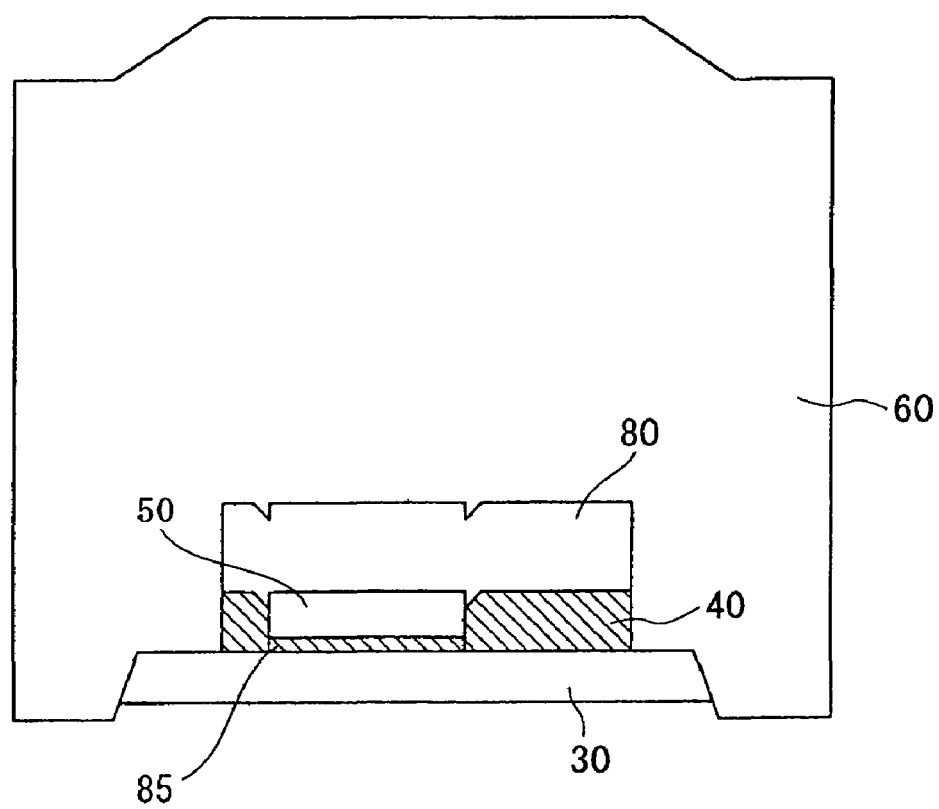
FIG. 1 is a cross-sectional view of an SIS junction, as an example of a thin layer device obtained by a method for production of the present invention. For example, the NbN layer (30) may be 200 nm, the MgO layer (40) may be 250 nm, the NbN layer (50) may be 200 nm, the $SiO_2$ layer (60) may be 20 μm, and the wire NbN layer (80) may be 350 nm.

In FIG. 1, an NbN-based SIS junction is shown as an example of a thin layer device obtained by a method for production of the present invention. Number 30 shows an epitaxial NbN layer, 40 is an epitaxial MgO layer as an insulation layer, 50 is an epitaxial NbN layer, 60 is a $SiO_2$ substrate, 80 is a wiring layer, and 85 is an NbN/MgO/NbN-SIS junction. An epitaxial NbN/MgO/NbN multilayer film forms an NbN/MgO/NbN-SIS junction, and on this multilayer structure substance a $SiO_2$ substrate is deposited to make a superconductive device. In accordance with a method of the present invention, a superconductive device with high performance as a thin layer device can be obtained by formation of an epitaxitial NbN/MgO/NbN-SIS junction part obtained by deposited the epitaxially grown NbN layer (30), the MgO layer (40) and the NbN layer (50) on a temporary substrate, not shown, at the lower part of the NbN layer (30), to complete an SIS junction by formation of the wiring layer (80) on the SIS junction part, subsequently forming the substrate (60) by film formation of $SiO_2$ on the SIS junction, and then removing the MgO temporary substrate by wet etching. By this procedure, an epitaxitial NbN/MgO/NbN-SIS junction is transcribed to a $SiO_2$ substrate.

In addition, an etching protection layer may be formed on the temporary substrate in advance, and then the multilayer structure substance may be formed on the etching protection layer, to prevent corrosion of the SIS junction by an etching agent, in wet etching to remove the temporary substrate. A method for production of the present invention is explained below using drawings.

Figure 2:
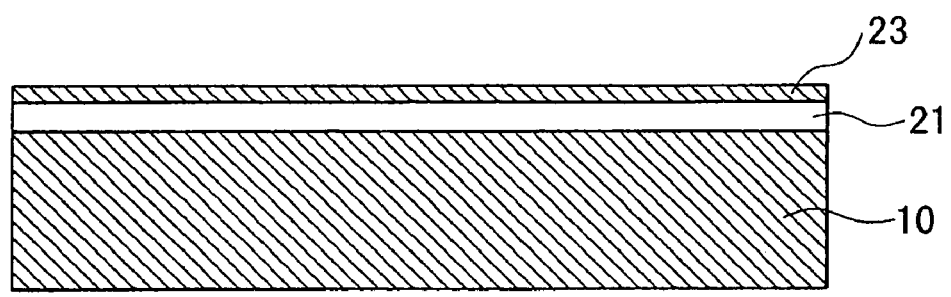
FIG. 2 explains one process of a method for production of a superconductive device, as an example of a thin layer device of the present invention, and shows an etching protection layer deposited on an MgO temporary substrate. For example, the NbN layer (21) on the MgO temporary substrate (10) may be 100 nm, and the MgO layer (23) may be 20 nm.

First of all, as shown in FIG. 2, an etching protection layer is formed on the temporary substrate (10) composed of single crystal of MgO and the like. The etching layer preferably has etching resistance to prevent corrosion of the SIS junction in etching, and also preferably has characteristics suitable to formation of a multilayer structure substance such as epitaxial growth, because formation of a multilayer structure substance on the etching protecting layer is necessary.

In the present invention, an etching protecting layer may be a single layer or may be composed of two or more layers, as long as it has the above characteristics. In the present invention, use of at least an acid-insoluble rock salt structure layer such as an NbN thin film, as an etching protecting layer, is preferable. However, when conductive material such as an NbN thin film is used as the acid-insoluble rock salt structure layer, it provides a problem in view of circuit, therefore final removal thereof is required. Therefore, when conductive material is used as an etching protecting layer, further film formation of a dielectrics layer composed of a rock salt structure substance, for example an MgO thin film is preferable. The MgO thin film can protect the SIS junction in removing the acid-insoluble rock salt structure layer (21) such as an NbN by fluorine plasma, after removing the temporary substrate (10) by etching, because of having high resistance to fluorine plasma.

Therefore, in the present invention, it is preferable to form at first the acid-insoluble rock salt structure layer (21) such as NbN on the temporary substrate (10), then form thereon the dielectrics layer (23) composed of a rock salt structure substance, and use two layers of the rock salt structure layer (21) and the dielectrics layer (23), as an etching protecting layer. The acid-insoluble rock salt structure layer (21) other than this includes a TiN thin film and the like. Formation of each layer composing an etching protecting layer is preferably by epitaxial growth, for example, a method by means of RF sputtering or DC reactive sputtering, or a combination thereof may be adopted. In addition, thickness of the rock salt structure layer (21) is not especially limited as long as it has enough resistance to protect a device from corrosion by an etching agent, however, preferably 10 to 200 nm. Thickness of the dielectrics layer (23) is also not especially limited, however, preferably 10 to 100 nm.

Figure 3:
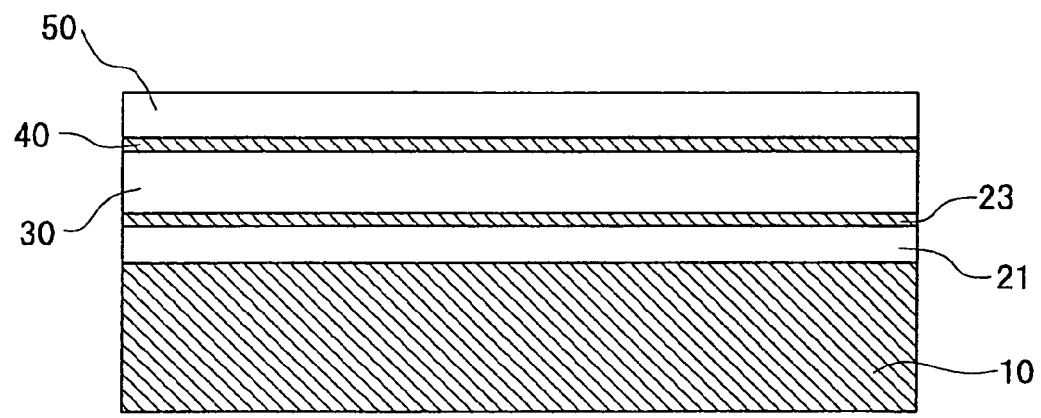
FIG. 3 explains one process of a method for production of a superconductive device, as an example of a thin layer device of the present invention, and shows a multilayer structure substance composed of an NbN layer, an MgO layer and an NbN layer deposited on an MgO temporary substrate and an etching protection layer. The MgO layer (40) between the NbN layer (30) and the NbN layer (50) may be 0.7 nm.

Then, as shown in FIG. 3, the NbN layer (30), the MgO layer (40) and the NbN layer (50) are formed to compose an epitaxitial NbN/MgO/NbN-SIS junction, which is a multilayer structure substance, on the etching protecting layers (21, 23). The NbN layer (30) is formed at first by epitaxial growth on the etching protecting layers (21, 23), then the MgO layer (40) is formed thereon. The MgO layer (40) may be formed by epitaxial growth, or by a method of RF sputtering or DC reactive sputtering, or a combination thereof. Then, the NbN layer (50) is formed on the MgO layer (40) by epitaxial growth. In the present invention, these layers are preferably formed by epitaxial growth. In this connection, the NbN layer (30), the MgO layer (40) and the NbN layer (50) become a lower part electrode layer, a dielectrics layer and an upper part electrode layer, respectively.

In addition, the MgO layer (40), as a tunnel barrier, is required to be a extremely thin film, so that a three layers film of NbN/MgO/NbN, as the above multilayer structure substance, functions as an NbN/MgO/NbN-SIS junction. As a method for producing such an NbN/MgO/NbN-SIS junction, conventionally well-known methods can be applied.

Figure 4:
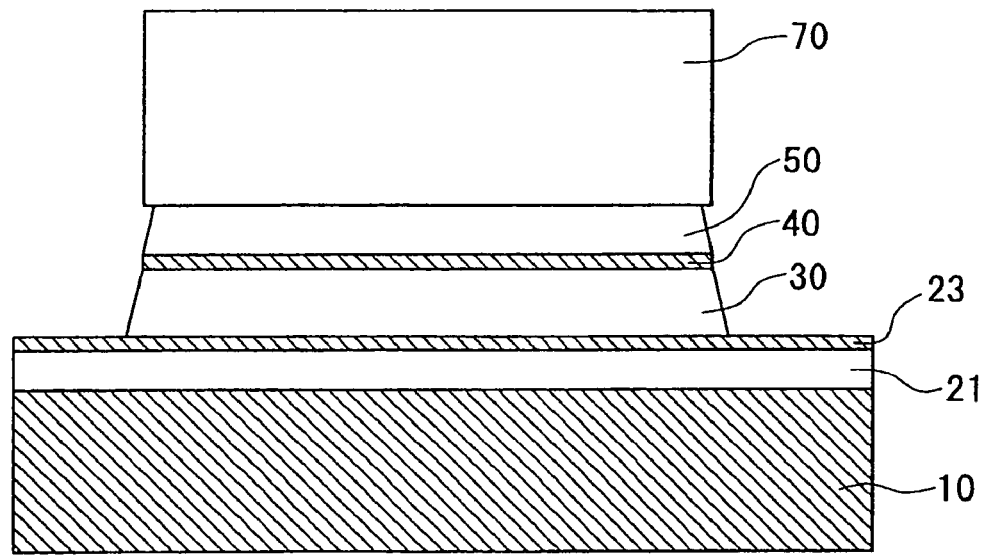
FIG. 4 explains one process of a method for production of a superconductive device, as an example of a thin layer device of the present invention, and shows patterned state of an NbN/MgO/NbN multilayer by a photoresist.
Figure 5:
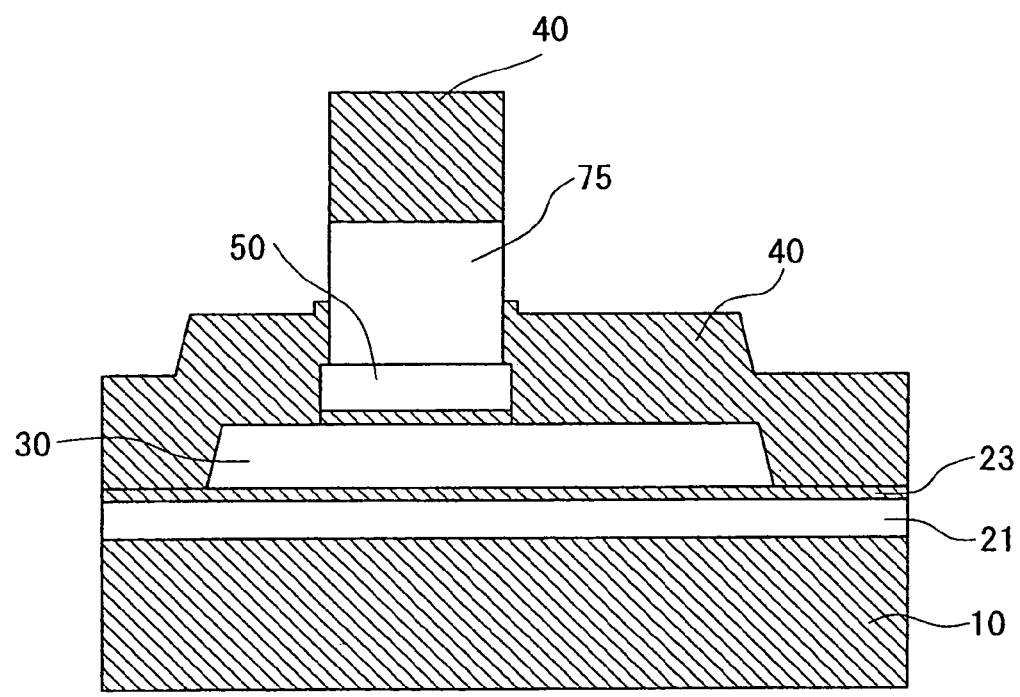
FIG. 5 explains one process of a method for production of a superconductive device, as an example of a thin layer device of the present invention, and shows formation state of an SIS junction part.
Figure 6:
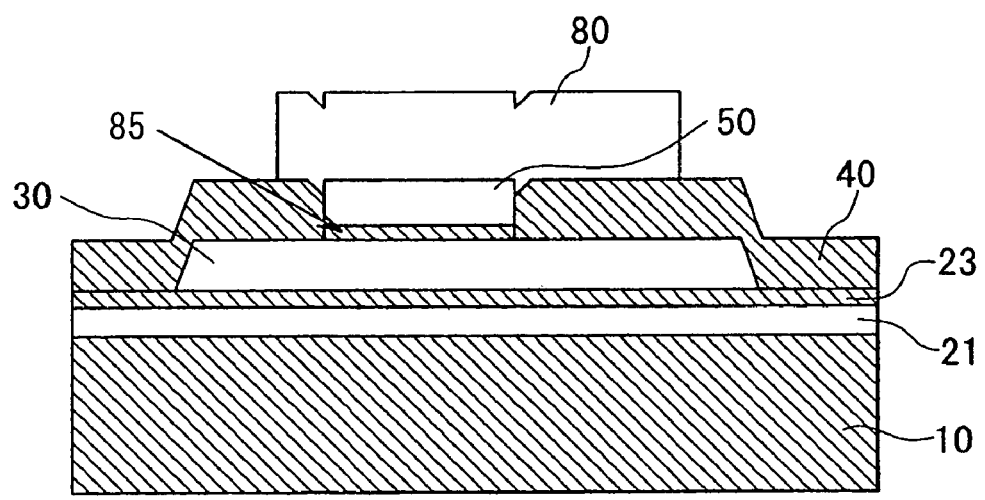
FIG. 6 explains one process of a method for production of a superconductive device, as an example of a thin layer device of the present invention, and shows film formation and patterning of a wiring layer at the upper part of an SIS junction part, and formation state of an SIS junction.

For example, as shown in FIG. 4, the photoresist layer (70) is applied on the three layers film of NbN/MgO/NbN, which is then subjected to patterning by photolithography. The exposed part of the three layers film, namely the NbN layer (50), MgO (40) and NbN (30) are removed by reactive etching using fluorine plasma and the like, and then the photoresist (70) is removed by a solvent. Then, as shown in FIG. 5, a resist (75) is applied, and the resist excluding a part to become an SIS junction is removed by photolithography, and the exposed part of the three layers film, namely the NbN layer (50) is removed by reactive etching using fluorine plasma and the like. After that, the MgO layer (40) is formed at the peripheral of the SIS junction part as an insulation layer. Then, by removing the photoresist (75) by a solvent, the MgO layer (40) formed at the upper part of the SIS junction part is also removed (called as a lift off method). Then, to form the wiring layer (80), an NbN layer is formed at the whole surface by epitaxial growth. Resist is applied, and the resist excluding a part to become the wiring layer is removed by photolithography, and the exposed part of the NbN layer is removed by reactive etching using fluorine plasma and the like to form the wiring layer (80). As the result of these steps, as shown in FIG. 6, the NbN/MgO/NbN-SIS junction (85), as a multilayer structure substance, is formed at the upper part of the etching protecting layer, namely the NbN layer (21) and the MgO layer (23).

Figure 7:
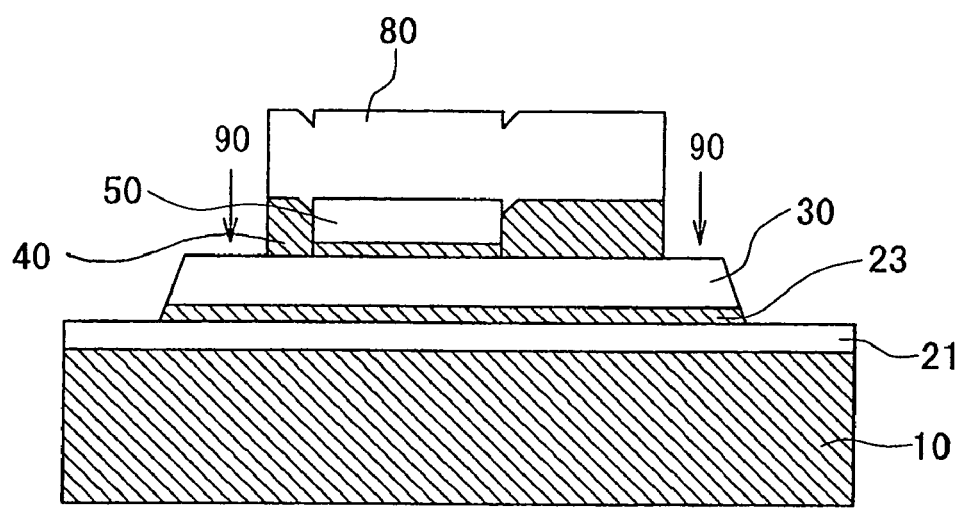
FIG. 7 explains one process of a method for production of a superconductive device, as an example of a thin layer device of the present invention, and shows removed state of an MgO layer which was exposed at the outer circumference of a wiring layer.

Subsequently, wet etching using phosphoric acid and the like, as an etching solution, is carried out to remove an exposed MgO layer. As shown in FIG. 7, the MgO layer (40) present at the outer circumference of the wiring layer (80) is removed by phosphoric acid (90). By this step, the MgO layer (40), as well as a part of the MgO thin film (23), which is the etching protecting layer, are removed. As the result of this step, the temporary substrate (10) becomes the MgO which can be exposed to an etching agent after forming a $SiO_2$ film on the SIS junction. In this connection, an etching agent used in wet etching is not limited to phosphoric acid as long as it enables to remove unnecessary MgO, and other ones can also be used.

Figure 8:
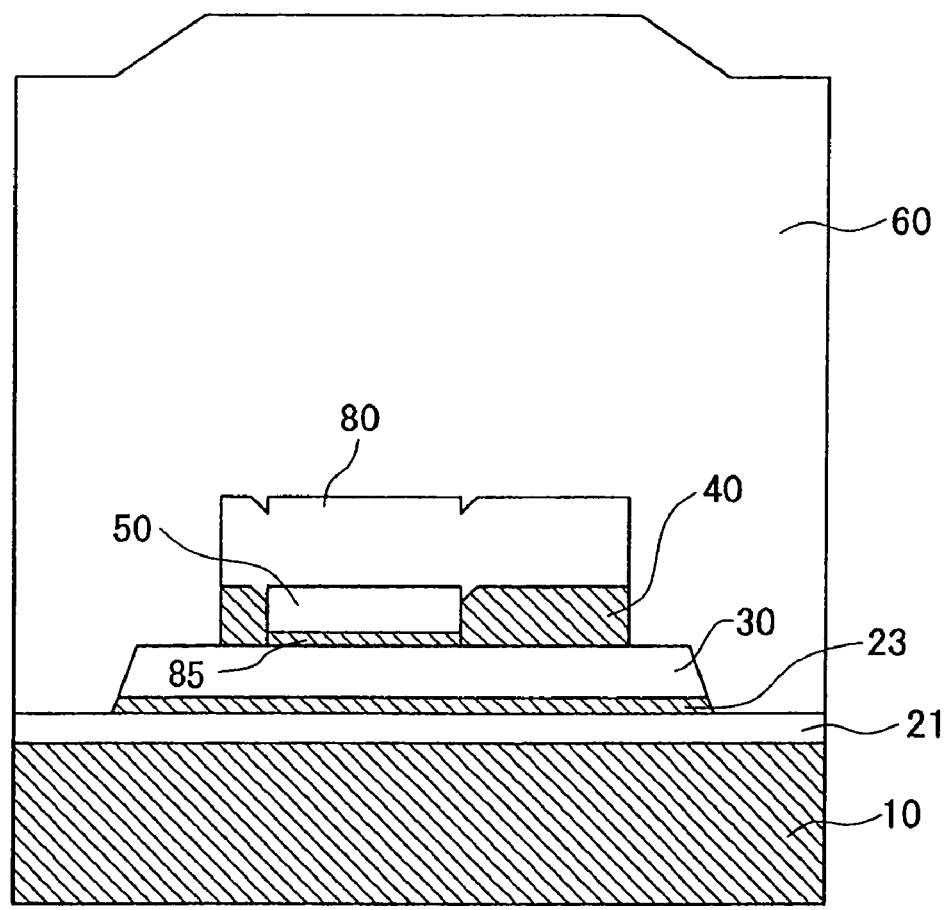
FIG. 8 explains one process of a method for production of a superconductive device, as an example of a thin layer device of the present invention, and shows deposited state of a substrate layer composed of $SiO_2$, on an NbN/MgO/NbN-SIS junction.

Then, as shown in FIG. 8, the substrate film (60) of $SiO_2$ and the like is formed on the SIS junction (85). Thus, by forming the NbN/MgO/NbN-SIS junction (85) in advance, as a multilayer structure substance, and then forming a $SiO_2$ substrate on the multilayer structure substance, a thin layer device wherein an SIS junction is mounted substantially on a $SiO_2$ substrate can be formed. In the present invention, $SiO_2$ as the substrate (60) can be formed by RF sputtering or DC reactive sputtering, and thickness thereof can be selected, as appropriate, depending on dielectric constant of a substrate and objective use frequency. In general, the thickness is not thicker than 40 μm in the case of 1 THz.

Figure 9:
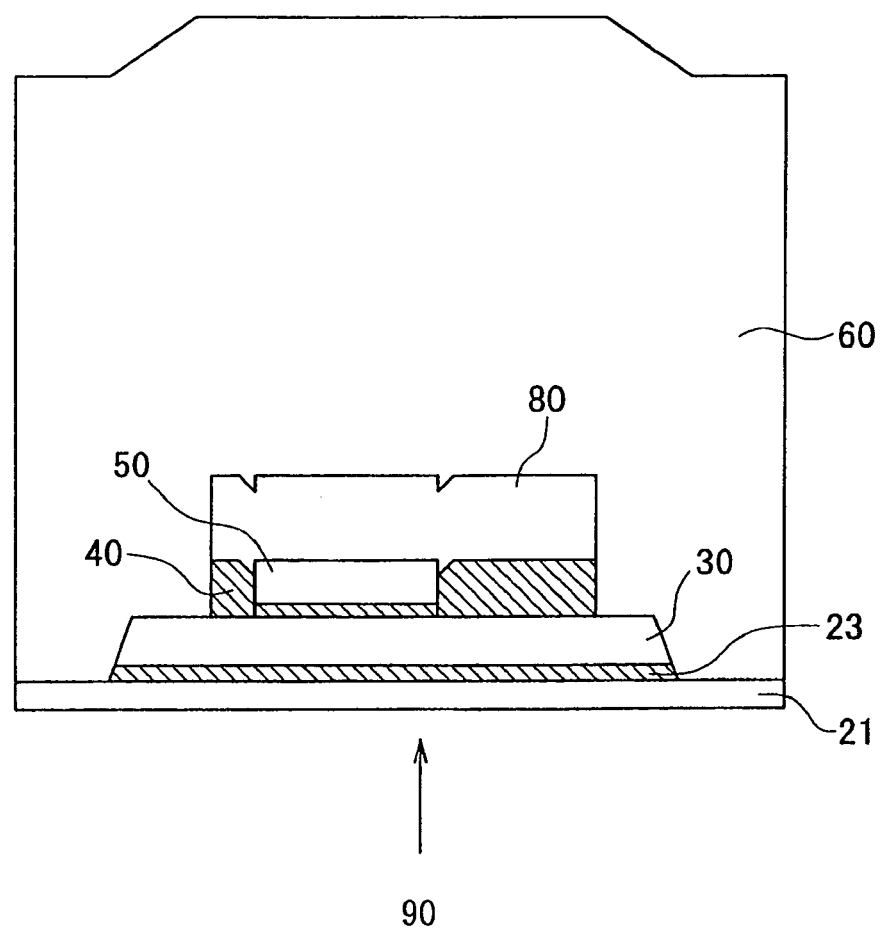
FIG. 9 explains one process of a method for production of a superconductive device, as an example of a thin layer device of the present invention, and shows removed state of an MgO temporary substrate by etching using phosphoric acid.

Then, an MgO substrate which is the temporary substrate (10) is removed by wet etching using an etching agent such as phosphoric acid (90) (see FIG. 9). Then, the NbN thin film (21) used as a wet etching protecting layer is removed by reactive etching system. Finally, by removing the MgO thin film (23) remaining at the lower part of the SIS junction is removed by phosphoric acid, a superconductive device shown in FIG. 1 which is an objective thin layer device is produced.

According to the method for production of the present invention, a $SiO_2$ substrate is formed so that the NbN/MgO/NbN-SIS junction is encompassed. Thickness of the $SiO_2$ substrate for use frequency of 1 THz is not thicker than 40 μm due to dielectric constant thereof. According to the present invention, uniformly polishing technology is not required, because an MgO temporary substrate and the like is removed by etching, and moreover, sufficient substrate thickness can be secured and a superconductive device excellent in mechanical strength can be produced, because a $SiO_2$ layer having relatively low dielectric constant can be used as a substrate. In addition, excellent control of substrate thickness is possible, because a substrate of $SiO_2$ and the like is produced by a film forming method.

In this connection, to produce a grounding conductor, the $SiO_2$ film is formed on the epitaxial NbN/MgO/NbN-SIS junction, and then a conductive thin film is formed, which is then subjected to patterning.

Epitaxial NbN is the most excellent low loss material at present in a frequency between 725 GHz to 1.4 THz. In the fields such as in global environmental measurement or radio astronomy and communication, a receiver in THz frequency range is required. An SIS receiver using epitaxial NbN has potential to become an excellent low noise receiver for this frequency band, and an HEB receiver is a low noise receiver having excellent characteristics in frequency range of several THz, where operation of an SIS receiver is difficult.

The present invention provides excellent mechanical strength and low loss performance in practical usage in these areas, and is significantly effective technology for all of electromagnetic wave receivers for a waveguide used in the fields of global environment measurement or radio astronomy and the next generation wireless communication. According to the present invention, an excellent epitaxial NbN/MgO/NbN-SIS receiver and the like, as a thin layer device, can be composed on a $SiO_2$ substrate effective as a submillimeter band material, and also conventional substrate polishing technology can be omitted. Specifically, the present invention can be applied to produce an electromagnetic wave receiver such as HEB and SIS for a submillimeter wave band, various detectors such as an X-ray detector, an IR bolometer and a terahertz detector, and a thin layer device such as a semiconductor device and a superconductor device.

EXAMPLES

The present invention is explained specifically below by means of Examples, however, these Examples should not limit the present invention.

Example 1

As a thin layer device of the present invention, a thin layer device having an epitaxial NbN/MgO/NbN-SIS junction as a multilayer structure substance on a $SiO_2$ substrate was produced.

First of all, an NbN thin film was epitaxially grown up to 100 nm thickness on an MgO temporary substrate having a thickness of 300 μm, then on the NbN thin film, an epitaxial MgO thin film in a thickness of 20 nm, was further formed as an etching protecting layer, by an RF sputtering method and a DC reactive sputtering method.

Furthermore, on this MgO thin film which is an etching protecting layer, a lower electrode layer in a thickness of 200 nm was formed by epitaxial growth, then an MgO layer in a thickness of about 0.7 nm was formed by an RF sputtering method, and an NbN layer in a thickness of 200 nm was formed by epitaxial growth as an upper electrode layer. Based on this, an epitaxial NbN/MgO/NbN-SIS junction was produced, and then the MgO thin layer at the peripheral of the NbN/MgO/NbN-SIS junction was removed by using a phosphoric acid solution as an etching agent. Then, a $SiO_2$ substrate having a thickness of 20 μm was formed by RF sputtering on the NbN/MgO/NbN-SIS junction, which is a multilayer structure substance. Then the MgO temporary substrate was removed using phosphoric acid as an etching agent, and subsequently the NbN thin layer which is an etching protection layer was removed by reactive etching, and finally, the MgO thin layer which is an etching protection layer, was removed using phosphoric acid.

According to these steps, a thin layer device composed of an NbN/MgO/NbN-SIS junction as a multilayer structure substance was produced on a $SiO_2$ substrate.

Example 2

Figure 10:
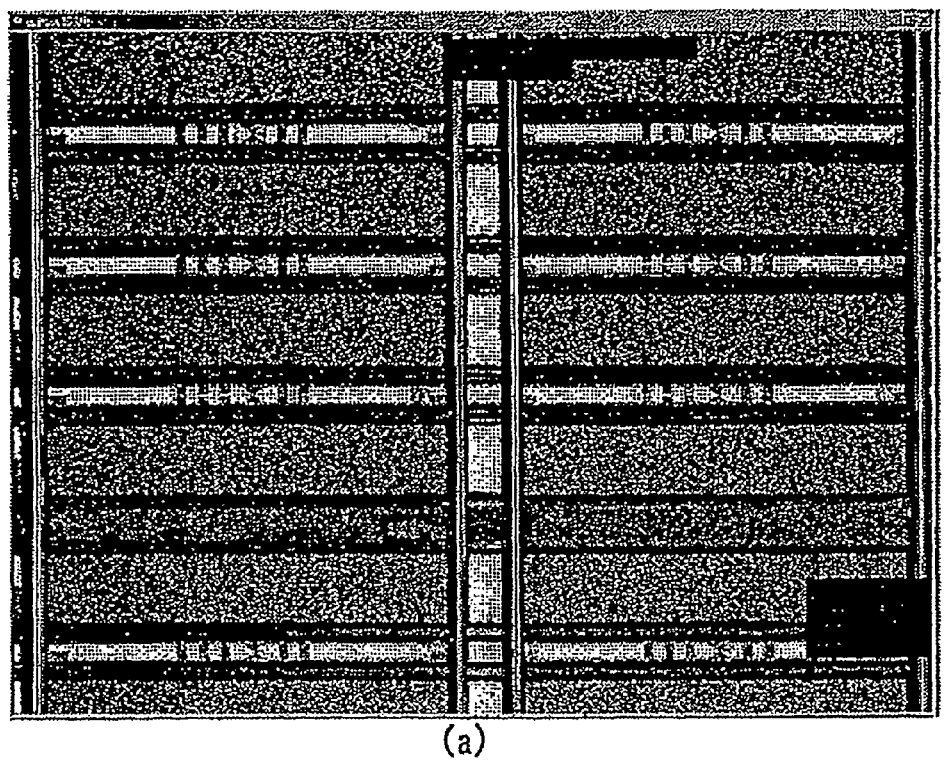
FIG. 10 shows an SIS mixer for a waveguide by producing an epitaxial NbN/MgO/NbN-SIS junction on a $SiO_2$ substrate, as an example of a thin layer device of the present invention.
Figure 10:
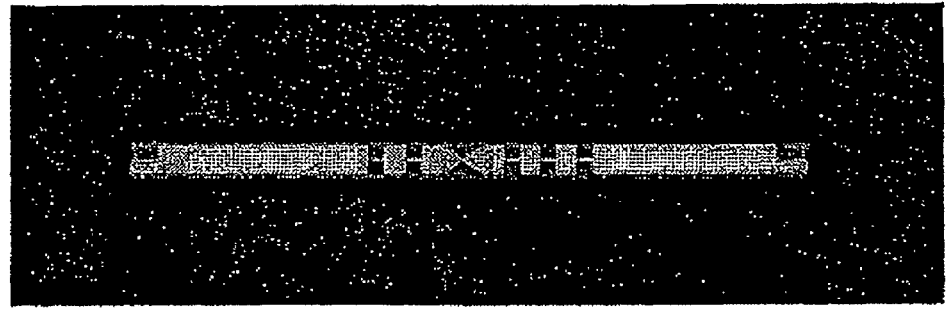
Figure 10:
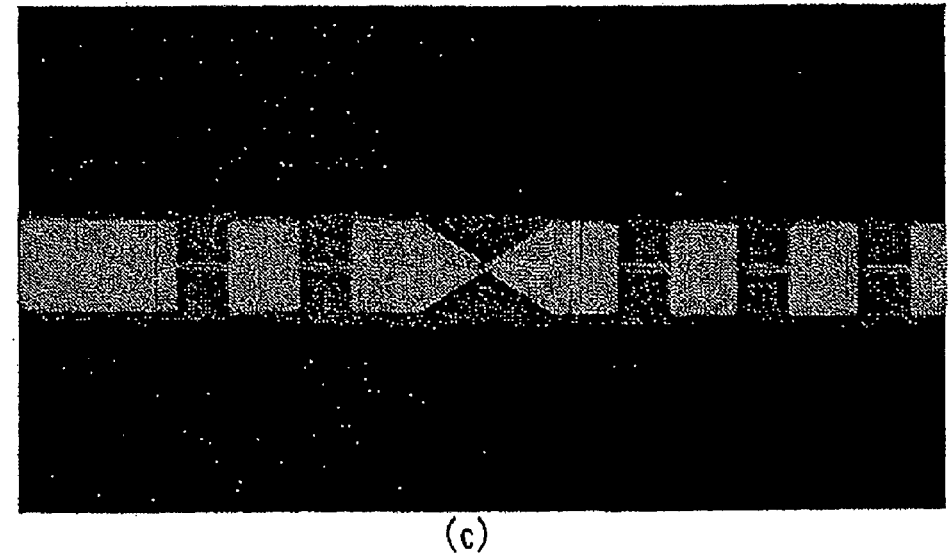

As a thin layer device of the present invention, an SIS mixer for an 870 GHz band waveguide was produced. A microscopic photo of the resultant SIS mixer for a waveguide is shown in FIG. 10. FIGS. 10(a) and (b) are cross-sectional views, obtained by using a dicing saw, of an SIS mixer for a waveguide on a $SiO_2$ substrate, and FIG. 10(c) shows a transmitted observation of the SIS mixer part from the side of the $SiO_2$ substrate having a thickness of about 20 μm.

Figure 11:
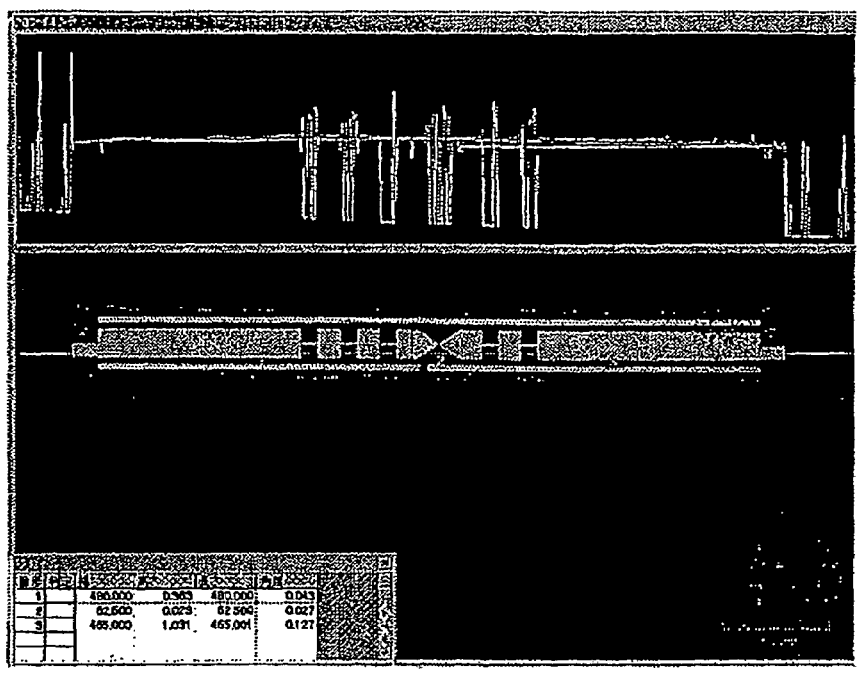
FIG. 11 is evaluation result of a $SiO_2$ substrate of a superconductive device, as an example of a thin layer device of the present invention, and FIGS. 11 (a) and (b) show warpage evaluation of the $SiO_2$ substrate and cross-sectional view of the $SiO_2$ substrate, respectively.
Figure 11:
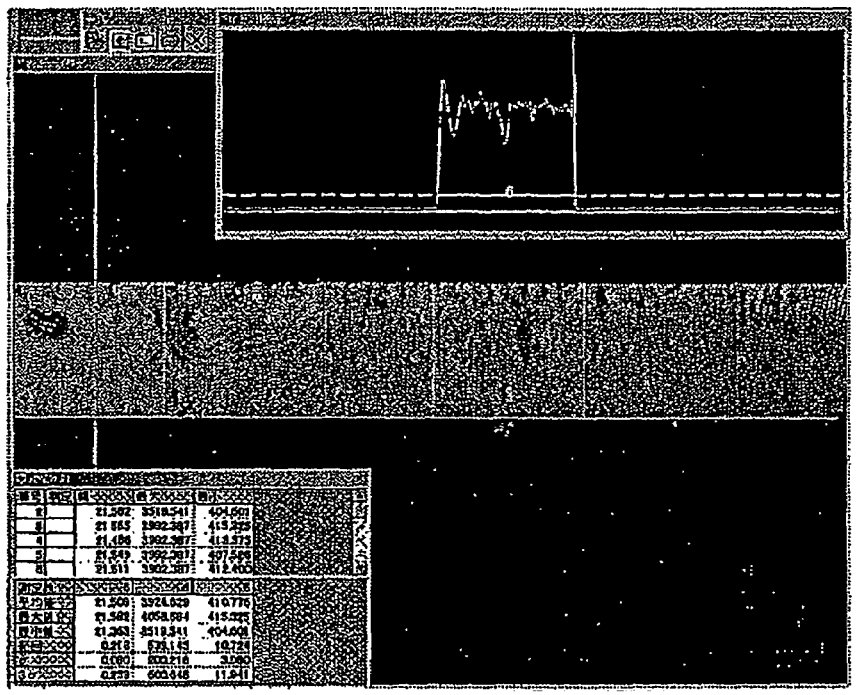

FIG. 11 shows evaluation results of warpage and substrate cross-section of the $SiO_2$ substrate of the resultant SIS mixer for a waveguide. As shown in FIG. 11(a), a rising central part of about 0.7 μm higher than the peripheral part was confirmed as evaluation result of substrate warpage in about 1 mm length zone. This means presence of small stress inside the substrate and having excellent flatness.

FIG. 11(b) shows measurement result of $SiO_2$ substrate thickness by a laser microscope. Substrate thickness was about 21 μm, which is nearly coincided with a substrate thickness of 20.2 μm predicted by film formation rate (error is ±4%), showing good controllability of substrate thickness.

Figure 12:
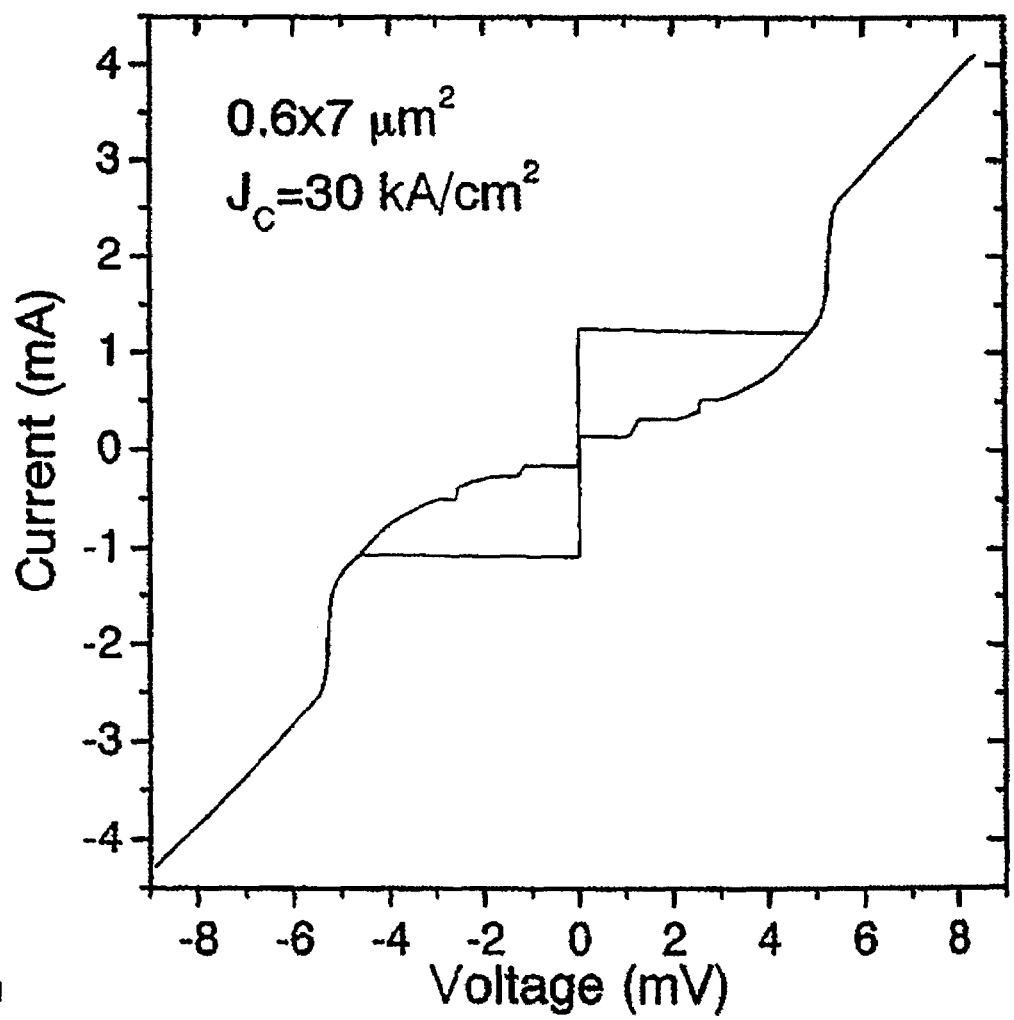
FIG. 12 shows current-voltage measurement result of an NbN/MgO/NbN-SIS junction, as an example of a thin layer device of the present invention.

FIG. 12 shows evaluation result of current-voltage characteristics of this SIS junction. Non-linearity specific to an SIS junction and accompanying hysteresis characteristics was able to be confirmed. This junction has weakened nonlinearity due to a high critical current density Jc of 30 $kA/cm^2$, however, high gap voltage (current rising at around 5.3 mV) specific to an epitaxial SIS junction, and clear resonance step induced by junction structure observed up to about 2.7 mV which corresponds to 1.3 THz was confirmed, which proved that an epitaxial SIS junction was produced on the $SiO_2$ substrate.

The invention claimed is:

1. A method for producing a thin layer device comprising the following steps:

forming an etching protection layer on a temporary substrate;

forming a multilayer structure substance by depositing thin films on the etching protection layer forming a substrate on the multilayer structure substance; and removing the temporary substrate by etching;

wherein the etching protection layer comprises an acid-insoluble rock salt structure layer formed on the temporary substrate and a dielectrics layer composed of a rock salt structure substance, and which comprises a step of forming the substrate on the multilayer structure substance, then a step of removing the temporary substrate by wet etching, and subsequently a step of removing the acid-insoluble rock salt structure layer by reactive etching.

2. The method for producing the thin layer device according to claim 1, which comprises a step of remove of removing the acid-insoluble rock salt structure layer by reactive etching, and then a step of remove of a dielectrics layer comprising the rock salt structure substance by wet etching.

3. The method for producing the thin layer device according to claim 2, which further comprises a step of formation of a good grounding conductor by film formation of conductive material on the substrate and patterning, after a step of formation of the substrate on the multilayer structure substance.

4. The method for producing the thin layer device according to claim 1, wherein the temporary substrate is a single crystal substrate.

5. The method for producing the thin layer device according to claim 1, wherein the temporary substrate is comprised of MgO.

6. The method for producing the thin layer device according to claim 1, wherein the multilayer structure substance is a multilayer formed by epitaxial growth.

7. A thin layer device produced by the method for producing the thin layer device according to claim 1.

8. A superconductive device, an SIS mixer or an HEB electromagnetic wave receiver, comprising the thin layer device according to claim 7.

9. A method for producing a thin layer device comprising the following steps:
    forming a multilayer structure substance by depositing thin films on a temporary substrate; and
    forming a substrate on the multilayer structure substance;
    wherein the multilayer structure substance is a multilayer formed by epitaxial growth, and
    wherein the multilayer structure substance is an NbN layer/an MgO layer/an NbN layer.

10. The method for producing the thin layer device according to claim 9, wherein the substrate is comprised of $SiO_2$.

11. A method for producing a thin layer device comprising the following steps:
    forming a multilayer structure substance by depositing thin films on a temporary substrate; and
    forming a substrate on the multilayer structure substance;
    wherein the multilayer structure substance is a multilayer formed by opitaxial growth, the multilayer structure substance is an NbN layer/an MgO layer/an NbN layer, and the temporary substrate is a single crystal substrate.

12. A method for producing a thin layer device comprising the following steps:
    forming of a multilayer structure substance by depositing thin films on a temporary substrate; and
    forming a substrate on the multilayer structure substance;
    wherein the multilayer structure substance is a multilayer formed by epitaxial growth, the multilayer structure substance is an NbN layer/an MgO layer/an NbN layer, and the temporary substrate is comprised of MgO.

* * * * *